US009514420B2

(12) United States Patent
Bose et al.

(10) Patent No.: US 9,514,420 B2
(45) Date of Patent: Dec. 6, 2016

(54) STROBE GATING ADAPTION AND TRAINING IN A MEMORY CONTROLLER

(71) Applicant: Rambus Inc., Sunnyvale, CA (US)

(72) Inventors: Soumya Bose, Bangalore (IN); Navin Kumar Mishra, Bangalore (IN); Abhilash Puzhankara, Thrissur (IN); Mahabaleshwara Mahabaleshwara, Udupi (IN); Karthikeyan Swamiappan, Tamilnadu (IN)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 14/824,080

(22) Filed: Aug. 12, 2015

(65) Prior Publication Data

US 2016/0049183 A1    Feb. 18, 2016

Related U.S. Application Data

(60) Provisional application No. 62/038,125, filed on Aug. 15, 2014.

(51) Int. Cl.
| *G11C 7/22* | (2006.01) |
| *G11C 7/10* | (2006.01) |
| *G11C 7/06* | (2006.01) |
| *G11C 7/08* | (2006.01) |
| *G06N 99/00* | (2010.01) |
| *G06F 13/16* | (2006.01) |
| *G11C 11/4096* | (2006.01) |

(52) U.S. Cl.
CPC ......... *G06N 99/005* (2013.01); *G06F 13/1668* (2013.01); *G11C 7/06* (2013.01); *G11C 7/067* (2013.01); *G11C 7/1078* (2013.01); *G11C 11/4096* (2013.01); *G11C 2207/2254* (2013.01)

(58) Field of Classification Search
CPC ......... G11C 7/1078; G11C 7/06; G11C 7/067; G11C 11/4096; G11C 2207/2254
USPC .................................... 365/193, 189.07, 207
See application file for complete search history.

(56) References Cited

U.S. PATENT DOCUMENTS

| 6,373,753 | B1 | 4/2002 | Proebsting | |
| 6,745,337 | B1* | 6/2004 | Trivedi et al. | 713/400 |
| 2002/0060588 | A1* | 5/2002 | Taylor | 327/108 |
| 2005/0089106 | A1* | 4/2005 | Cho et al. | 375/257 |
| 2006/0193188 | A1* | 8/2006 | Smela et al. | 365/221 |
| 2009/0307521 | A1 | 12/2009 | Lee et al. | |
| 2010/0238695 | A1* | 9/2010 | Ono | G11C 5/063 365/51 |
| 2011/0019489 | A1* | 1/2011 | Huang | G11C 7/1051 365/193 |
| 2013/0297895 | A1* | 11/2013 | Sakamaki et al. | 711/154 |

(Continued)

Primary Examiner — Ly D Pham
(74) Attorney, Agent, or Firm — Fenwick & West LLP

(57) ABSTRACT

A memory controller includes a differential receiver circuitry to receive a differential data strobe signal pair and to generate a first data strobe signal based on the differential data strobe signal pair. The differential data strobe signal pair comprises a first signal and a second signal. The memory controller also includes a single ended receiver circuitry to receive the first signal of the differential data strobe signal pair and to generate a second data strobe signal based on the first signal of the differential data strobe signal pair. The memory controller further includes circuitry to generate a gating signal for gating the first data strobe signal, the circuitry generating the gating signal based on the second data strobe signal.

14 Claims, 4 Drawing Sheets

(56) References Cited

U.S. PATENT DOCUMENTS

2015/0028954 A1* 1/2015 Tyan .................. G11C 11/4076
                                                            330/257
2015/0092510 A1* 4/2015 Yildirim et al. ......... 365/233.13
2015/0124539 A1* 5/2015 Iijima ................. G11C 11/4076
                                                            365/193

* cited by examiner

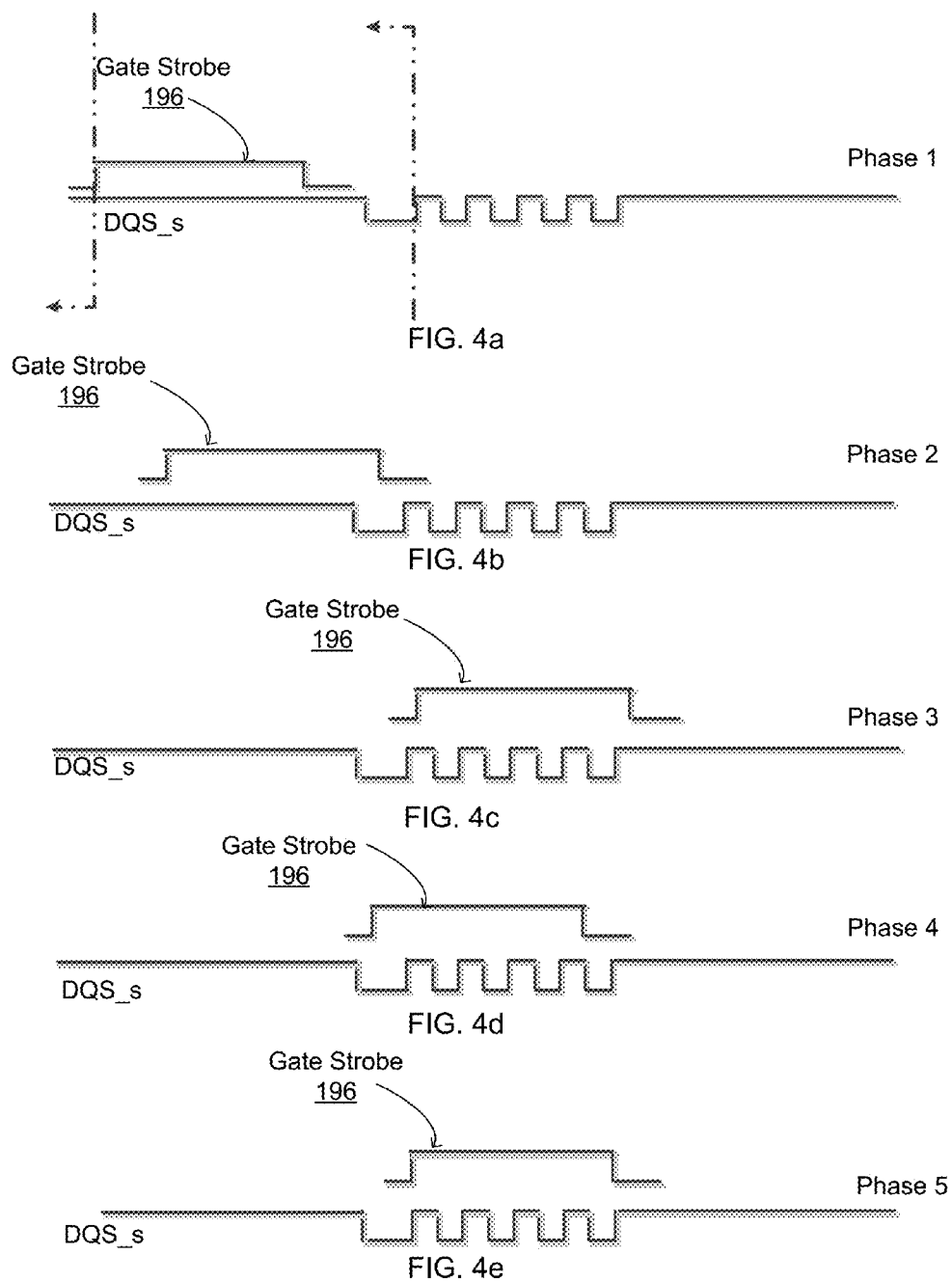

STROBE GATING ADAPTION AND TRAINING IN A MEMORY CONTROLLER

CROSS REFERENCE TO RELATED APPLICATIONS

This application claims the benefit of U.S. Provisional Application 62/038,125 filed on Aug. 15, 2014, which is hereby incorporated by reference in its entirety.

BACKGROUND

In a memory system, data signals received from memory devices are sampled by a memory controller using data strobe signals. The data strobe signals may only be active for during a small window of time. The location of the active window can be affected by signal propagation delay, temperature and voltage changes. If the window is not properly estimated, it can result in incorrect data being read by the memory controller.

BRIEF DESCRIPTION OF THE DRAWINGS

The teachings of the embodiments herein can be readily understood by considering the following detailed description in conjunction with the accompanying drawings.

FIGS. 4a-4e include waveforms illustrating operations of a read gate training circuit of the memory controller of FIG. 1, according to an embodiment.

DETAILED DESCRIPTION OF EMBODIMENTS

Reference will now be made in detail to several embodiments of the present disclosure, examples of which are illustrated in the accompanying figures. It is noted that wherever practicable similar or like reference numbers may be used in the figures and may indicate similar or like functionality. The figures depict embodiments of the present disclosure for purposes of illustration only. One skilled in the art will readily recognize from the following description that alternative embodiments of the structures and methods illustrated herein may be employed without departing from the principles, or benefits touted, of the disclosure described herein.

In one embodiment, disclosed is an approach for adjusting an active data strobe window of a gating signal in a memory controller. In one embodiment, a memory controller includes differential receiver circuitry to receive a differential data strobe signal pair and to generate a first data strobe signal by comparing first and second signals of the differential data strobe signal pair. Since the first signal and second signal are complementary during an active zone, the first data strobe signal (e.g. main data strobe signal) has a reliable output during this active zone. However, since the first signal and a second signal have like values and are non-complementary during the non-active zone, the first data strobe signal generated from the differential data strobe signal pair has an indeterministic and unreliable value during the non-active zone. Thus, the memory controller also includes a single ended receiver circuitry to receive the first signal of the differential data strobe signal pair and a reference voltage, and to generate a second data strobe signal (e.g. secondary data strobe signal) by comparing the first signal of the differential data strobe signal pair with the reference voltage. The second data strobe signal has a more reliable value during the non-active zone than the first data strobe signal and can thus be used reliably during the non-active zone, instead of the first data strobe signal.

The memory controller further includes circuitry to generate a gating signal for gating the first data strobe signal. The gating signal is generated based on the first and second data strobe signals and a gate strobe signal. An active data strobe window indicated by the gating signal is appropriately determined by the circuitry so as to compensate for latency and drift, thereby ensuring that the first data strobe signal is gated for sampling during an accurate gating window.

Figure 1:
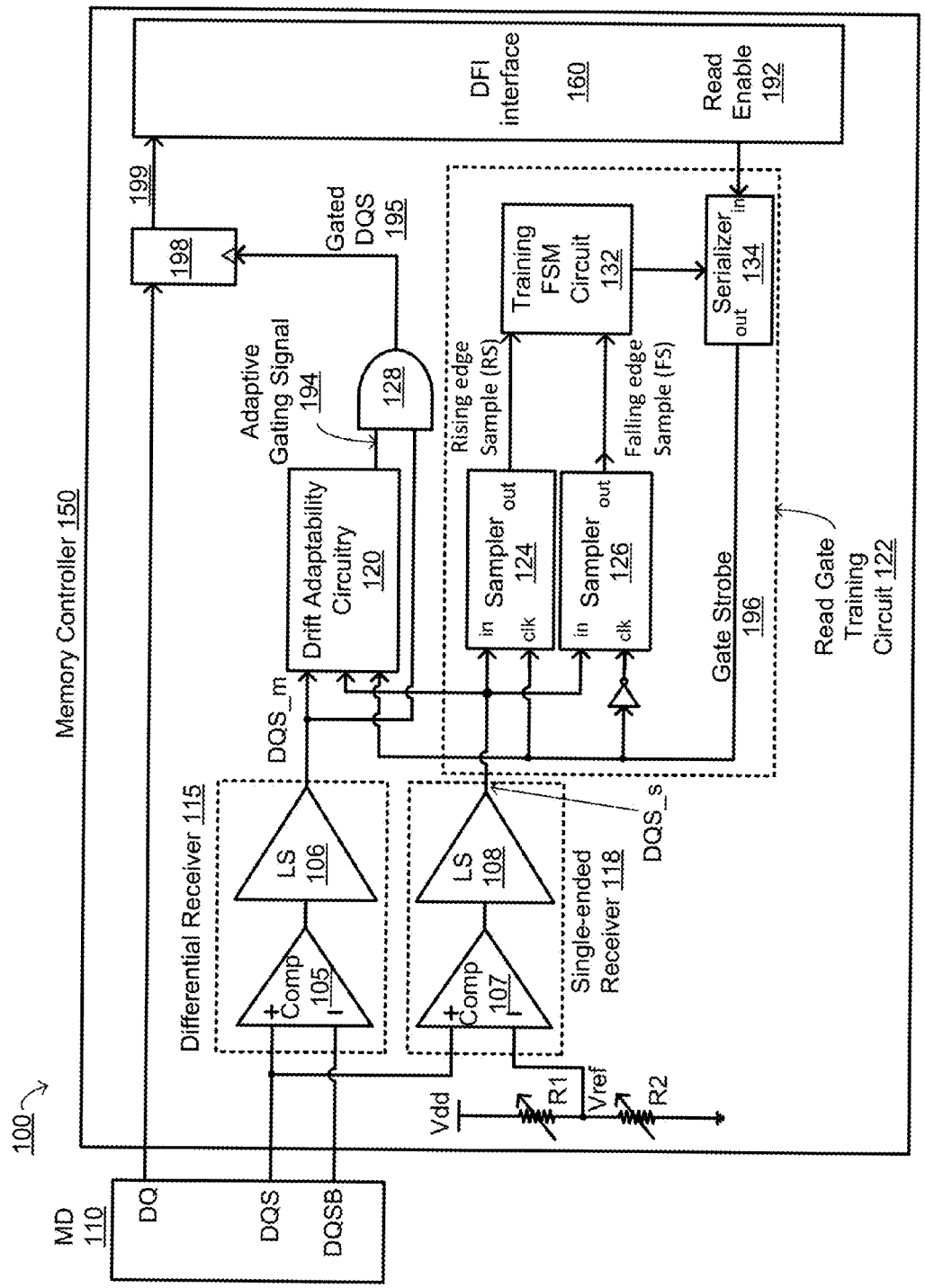
FIG. 1 illustrates a memory system including a memory controller, according to one embodiment.
Figure 2:
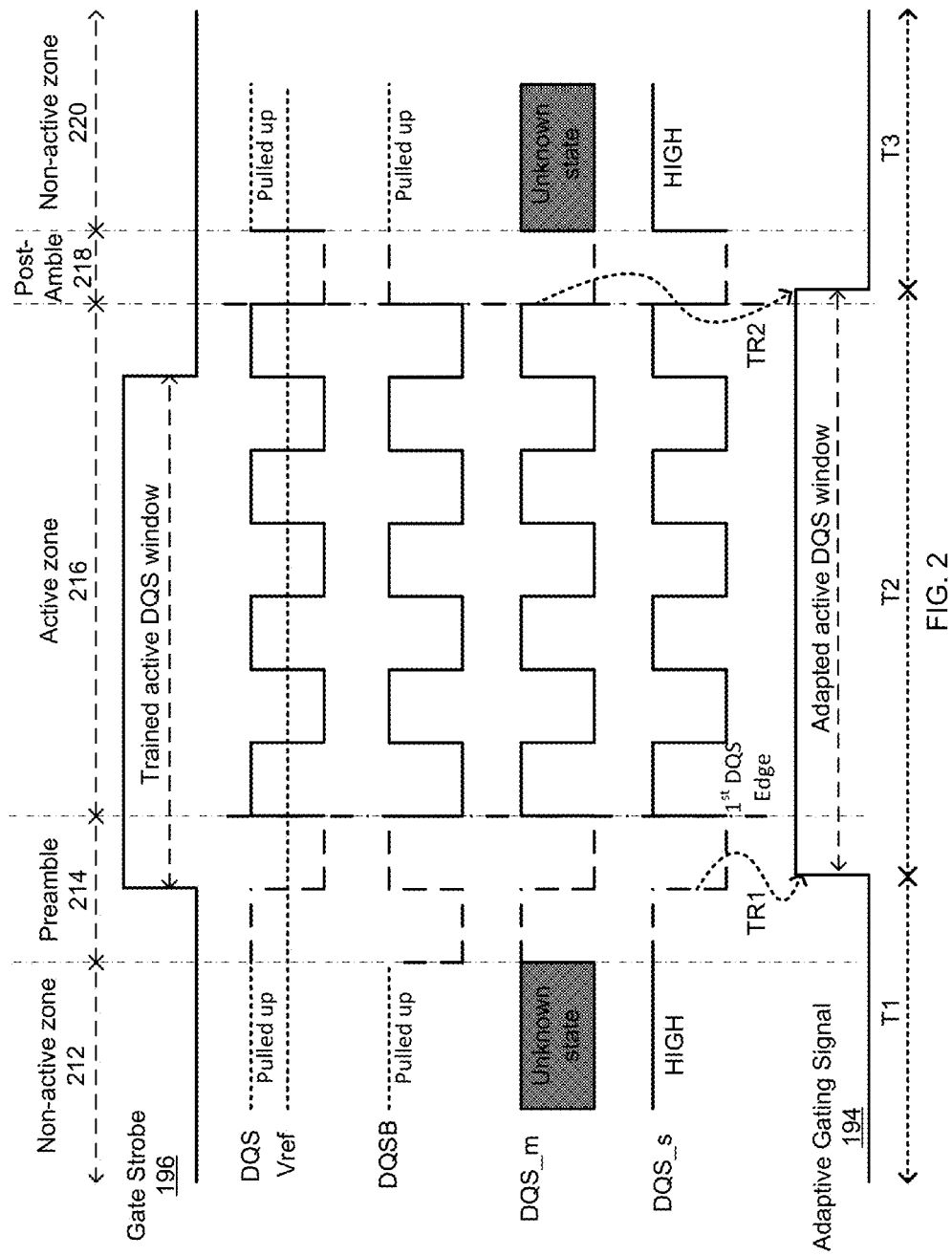
FIG. 2 includes waveforms illustrating signal timing within the memory controller of FIG. 1, according to an embodiment.

FIG. 1 illustrates elements of a memory system 100 including a memory controller 150 coupled to a memory device MD 110, according to one embodiment. FIG. 2 includes waveforms illustrating signal timings for various signals within the memory controller 150 of FIG. 1, according to one or more embodiments.

Memory controller 150 manages the flow and timing of data written to memory device MD 110 and data retrieved from memory device MD 110. The memory controller 150 also manages the flow of command and signaling used to specify the nature and timing of memory accesses with the memory device 110. In one embodiment, the memory controller 150 can be part of an application specific interface circuit (ASIC) device, a central processing unit (CPU), graphics processing unit (GPU) or other device. In one embodiment the memory device 110 stores the data in dynamic random access memory (DRAM). In other embodiments, the memory device can be a non-volatile type of memory device, such as a Flash or EEPROM memory device have a storage array of non-volatile memory cells. The memory controller and memory device can be housed in a common package, e.g., such as a Secure Digital (SD) Card.

As illustrated in FIG. 1, the memory controller 150 receives a differential data strobe signal pair DQS/DQSB from the memory device 110 via a memory bus. The differential data strobe signal pair includes a positive data strobe signal (DQS) and a negative data strobe signal (DQSB) which facilitate sampling, by the memory controller 150, of a read data signal (DQ) received by the memory controller 150 from the memory device 110. The read data signal (DQ) is to be sampled during a sampling interval of an active zone (shown in FIG. 2) of the positive data strobe signal (DQS) and second data strobe signal (DQSB), based on the rising and/or falling edges of the data strobe signals.

Accordingly, as illustrated in the waveforms of FIG. 2, the positive signal (DQS) and negative signal (DQSB) of the differential data strobe signal pair are characterized by an active zone 216, non-active zones 212 and 220, a preamble zone 214 and a postamble zone 218. The active zone 216 is an interval during which the data strobe signals are active and includes edges to be used for sampling of the read data signals DQ. The pre-amble zone 214 immediately precedes and is adjacent in timing to the active zone 216 and includes signal edges that are not to be used for sampling of the read data signals DQ. A post-amble zone 218 immediately follows and is adjacent in timing to the active zone 216.

During the active zone 216, preamble 214 and post-amble 218, the positive signal (DQS) and the negative signal (DQSB) are complementary in signal values. The positive strobe signal (DQS) and negative strobe signal (DQSB) thus toggle every clock cycle but are out of phase with respect to one another. On the other hand, as shown in FIG. 2, during the non-active zones corresponding to the signal intervals outside of the active zone 216, preamble 214 and post-amble 218, the positive strobe signal (DQS) and the negative strobe signal (DQSB) have like values as both signals are pulled up to logic high values.

Referring to FIG. 1, the memory controller 150 further receives a read enable 192 signal from the DFI interface 160. DFI is an industry specification that defines a standard interface between a double data rate (DDR) memory controller logic and the physical layer (PHY) interface on the memory controller chip. A read enable signal can be any signal generated by the internal memory controller logic which represents approximately when the logic is expecting to sample incoming read data. The read enable signal 192 defines the initial timing for an active DQS window. The initial active DQS window is a period of time during which active DQS edges for data reads are believed to be present.

A timing of the initial active DQS window may not correctly correspond or align with the active DQS edges due to unknown signal propagation delays across the memory bus. Thus, the read gate training circuit 122 performs an initial calibration or training to align an active window edge of the gate strobe signal window with a first DQS sampling edge. The read gate training circuit 122 generates a gate strobe signal 196 indicative of a trained active DQS window that is more accurate than the initial active DQS window. Typically, this calibration is performed during initialization and is not performed during each read cycle.

The drift adaptability circuitry 120 additionally adapts the gate strobe signal 196 to generate an adaptive gating signal 194 to further correct for drift due to temperature and voltage changes that may cause misalignment between the trained active DQS window of the gate strobe signal 196 and the active sampling zone 216. The drift adaptability circuitry 120 generates the adaptive gating signal 194 to be indicative of an adapted active DQS window that is an adjusted version of the trained active DQS window from the gate strobe signal 196.

As shown in FIG. 1, the memory controller 150 further includes a differential receiver circuitry 115, a single ended receiver circuitry 118, drift adaptability circuitry 120, strobe gating circuit 128, and a read gate training circuit 122.

The differential receiver circuitry 115 receives a differential data strobe signal pair DQS/DQSB during data reads. The differential data strobe signal pair includes a positive data strobe signal (DQS) and a negative data strobe signal (DQSB). The differential receiver circuitry 115 compares the positive data strobe signal (DQS) and the negative data strobe signal (DQSB) to generate a main data strobe signal DQS_m. The state of the main data strobe signal DQS_m indicates whether the positive strobe signal DQS is higher than or lower than the negative strobe signal DQSB.

In one or more embodiments, the differential receiver circuitry 115 includes a first comparator 105 to compare the positive strobe signal (DQS) and the negative strobe signal (DQSB). An output signal of the first comparator 105 is optionally DC level shifted by the level shifter 106, resulting in the main data strobe signal (DQS_m).

FIG. 2 illustrates a timing waveform of the main data strobe signal (DQS_m). As illustrated in the waveforms of FIG. 2, during the preamble 214, active zone 216 and post-amble 218, since the positive strobe signal (DQS) and the negative strobe signal (DQSB) are complementary, the main data strobe signal DQS_m has a reliable value.

On the other hand, as shown in FIG. 2, during the non-active zone 212 and 220, the positive strobe signal (DQS) and the negative strobe signal (DQSB) have like values—both signals are pulled up to logic high values. Thus, a result of comparing non-complementary and like logic levels at the differential receiver circuitry 115 causes the main data strobe signal DQS_m to have an unreliable and indeterminate voltage level during the non-active zone 212.

To accurately and reliably capture the logic state of the data strobe signals DQS/DQS_B during the non-active zone 212, the memory controller 150 further includes a single ended receiver circuitry 118. The single ended receiver circuitry 118 receives the positive signal (DQS) of the differential data strobe signal pair and a reference voltage signal (Vref). The single ended receiver circuitry 118 generates a secondary data strobe signal (DQS_s) by comparing the first signal (DQS) to the reference voltage (Vref). The state of the secondary data strobe signal DQS_s indicates whether the positive strobe signal DQS is higher than or lower than the reference voltage (Vref). The reference voltage signal (Vref) may be generated using a resistive divider R1 and R2.

The single ended receiver circuitry 118 includes a second comparator 107 to compare the positive strobe signal (DQS) from the differential data strobe signal pair and the reference voltage signal (Vref). The signal resulting from the comparison of the positive strobe signal (DQS) and the reference voltage (Vref) is also optionally DC level shifted by the level shifter 108, resulting in the secondary data strobe signal (DQS_s).

FIG. 2 illustrates a timing waveform of the secondary data strobe signal (DQS_s). As illustrated in FIG. 2, the secondary data strobe signal (DQS_s) is a more reliable static logic HIGH signal in the non-active zone 212 and does not include spurious edges.

Conceptually, differential receiver 115 represents a main receive path for data strobe signaling. Single ended receiver 118 represents a secondary receive path for data strobe signaling that is parallel to the main receive path. The secondary receive path produces a secondary data strobe signal DQS_s that is more reliable than the main data strobe signal DQS_m during the non-active zone 212. The secondary data strobe signal DQS_s can be used for both training of the active DQS window and for adaption of the active DQS window, as will now be explained.

The memory controller 150 includes a read gate training circuit 122 that receives the secondary data strobe signal DQS_s and read enable signal 192 indicating an initial active DQS window. The read gate training circuit 122 then uses these two inputs to perform an initial, and optionally periodic, alignment of the gate strobe signal 196 window edge with the first active sampling edge of the active zone of the data strobe signals.

As shown, the read gate training circuit 122 includes a first sampling circuit 124, to generate a rising edge strobe sample (RS) by sampling the secondary data strobe signal (DQS_s) at a rising edge of the active window indicated by the gate strobe signal 196. The read gate training circuit 122 further includes a second sampling circuit 126 to generate a falling edge strobe sample (FS) by sampling the secondary strobe signal (DQS_s) at a falling edge of the active window of the gate strobe signal 196. The samplers 124 and 126 may be implemented with edge triggered flip flops.

The read gate training circuit 122 also includes a training finite state machine (FSM) 132 that implements a read gate training algorithm to generate a delay code indicating a delay adjustment that needs to be performed on the active DQS window of the gate strobe signal 196 for appropriate and accurate alignment with the active zone 216. The training circuitry 122 also includes a delay circuit 134 to generate the gate strobe signal 196 from the read enable signal 192 by adjusting a delay of the read enable signal 192 according to the delay code. The training algorithm will be further explained with reference to FIGS. 4a-4e.

The drift adaptability circuitry 120 generates an adaptive gating signal 194 based on the main data strobe signal (DQS_m), the secondary data strobe signal (DQS_s), and the gate strobe signal 196. The adaptive gating signal 194 indicates an adaptive active DQS window that is an adjusted version of the trained active DQS window from the gate strobe signal 196. The drift adaptability circuitry 120 generates an adaptive gating signal 194 such that the timing of the active window of the adaptive gating signal 194 accurately coincides with the active sampling zone 216, thereby correcting for drift in latency that may occur since training of the active DQS window.

Figure 3:
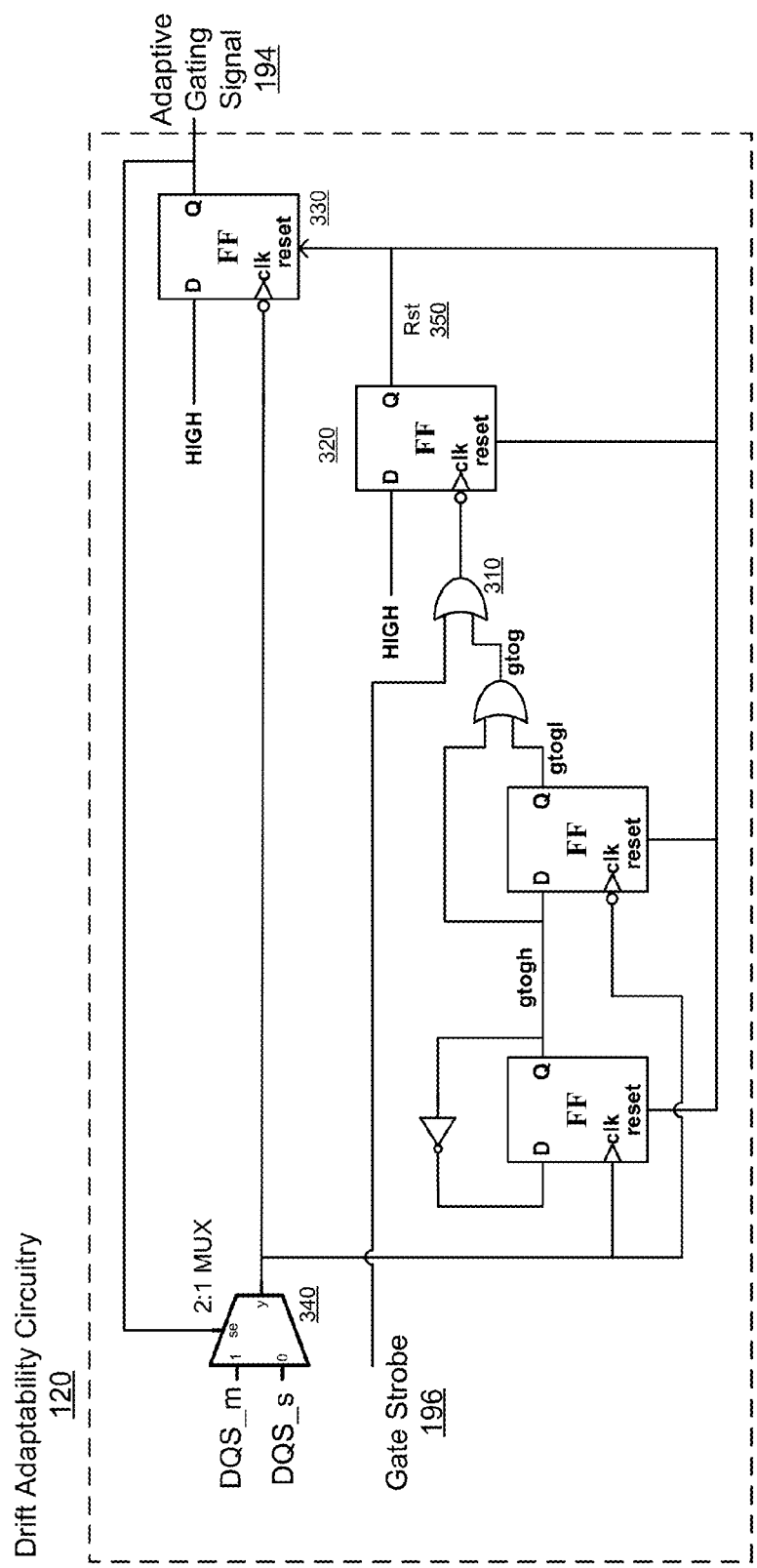
FIG. 3 is a detailed view of drift adaptability circuitry of the memory controller from FIG. 1, according to an embodiment.

As illustrated in FIG. 2, and explained further with reference to FIG. 3, the drift adaptability circuitry 120 is triggered on TR1 by the falling pre-amble edge of the secondary data strobe signal (DQS_s), remains active in the active zone 216 to generate a logic HIGH for an adapted active DQS window, and is triggered off TR2 on the last active falling edge of the main data strobe DQS_m signal immediately following the end of the trained active DQS window. The adaptive gating signal 194 generated by the drift adaptability circuitry 120 and illustrated in FIG. 2 therefore includes an adapted active DQS window that is synchronized to coincide in timing with the active zone 216 such that it starts just prior to the active zone 216 and ends just after the end of the active zone 216.

The gating circuit 128 receives the adaptive gating signal 194 and gates the main data strobe signal (DQS_m) with the gating signal 194. The gating circuit 128 then outputs a gated data strobe signal 195. The gating circuit 128 may be implemented with an AND gate. A data sampling circuit 198 uses the gated data strobe signal 195 to sample the read data signal DQ, thereby generating sampled read data 199. As explained above and illustrated in FIG. 2, the adaptive gating signal 194 generated by the drift adaptability circuitry 120 includes an adapted active DQS window that is synchronized to coincide with the active zone 216.

FIG. 3 is a detailed view of the drift adaptability circuitry 120 of the memory controller 150 from FIG. 1, according to an embodiment.

The drift adaptability circuitry 120 comprises an OR gate 310, flip flops 320 and 330, and selection circuit (e.g., 2:1 multiplexer) 340, among other circuitry. As shown in the waveforms of FIG. 2, in the non-active zone 212 the gate strobe signal 196 is low and DQS_s is high. MUX 340 selects DQS_s as the MUX output. Flip flop 330 is triggered off the MUX output, which is provided with the gate strobe signal 196. As a result, the state of the gate strobe signal 196 provides an enabling logic level for the output of drift adaptability circuitry 120 during time interval T1.

In the preamble period 214, DQS_s has a falling edge. The falling edge causes the flip flop 340 to sample the logic High D-input and switches the adaptive gate signal 194 to logic 1. This causes the switch input to the selection MUX 340 to toggle to a value of logic 1, and the selection MUX 340 selects the main data strobe signal (DQS_m) to be propagated to the output of the MUX 340. As a result, the drift adaptability circuitry 120 becomes driven off the main data strobe signal (DQS_m) instead of the secondary data strobe signal DQS_s during interval T2.

During the active zone 216, the gate strobe signal 196 is high, which prevents OR gate 310 from transitioning low and causing an assertion of the reset signal 350. When the trained active DQS window of the gate strobe signal 196 ends, and the gate strobe signal 196 transitions to a value of logic 0. OR gate 310 outputs a logic 0 responsive to a first falling edge of the main data strobe signal (DQS_m) that occurs after the termination of the trained active DQS window. The high to low logic transition at the output of the OR gate 310 causes a high logic level to be output as the reset signal 350, thereby triggering a reset of the flip flop 330 and in turn causing the adaptive gating signal 194 to be de-asserted, effectively disabling the output drift adaptability circuit 216. During interval T3, MUX 340 again selects DQS_s as the MUX output.

In other words, and as illustrated in FIG. 2, the drift adaptability circuitry 120 is triggered on the falling preamble edge of the secondary data strobe signal (DQS_s) to assert the adaptive gating signal 194, remains enabled in the active zone 216 to generate a logic HIGH on the adaptive gating signal 194, and is triggered off by the last active falling edge of the main data strobe signal (DQS_m) immediately following the de-assertion of the gate strobe signal 196 and prior to the post-amble, to de-assert the adaptive gating signal 194.

FIGS. 4a-4e include waveforms illustrating operations of the read gate training circuit 122 of FIG. 1, according to an embodiment. As explained with reference to FIG. 1, the read gate training circuit 122 includes first and second sampling circuits 124 and 126 which sample, respectively, the secondary data strobe signal DQS_s during the rising edge and falling edge of the gate strobe signal 196. The sampling generates first and second samples referred to herein as "rising sample" (RS) and "falling sample" (FS).

The read gate training algorithm performed by the read gate training circuit 122 of FIG. 1 comprises five phases as explained with reference to the timing diagrams FIGS. 4a-4e below. During each phase, the read gate training algorithm determines a measure of adjustment (e.g. advancement or delay) to be performed on the active DQS window based on values of RS and FS obtained during that phase. To this end, the read gate training algorithm broadly comprises coarse training phases (FIGS. 4a-4d) and fine training phases (FIG. 4e) that vary with a magnitude of adjustment made to the active DQS window of the gate strobe signal 196 during the phase. During the coarse training phases, the active DQS window of the gate strobe signal 196 is advanced in larger step sizes (e.g., 0.25 clock cycles (CK), 0.5 CK, 0.75 CK or 1 CK); during the fine training phase, the active DQS window of the gate strobe signal 196 is advanced by smaller measures, such as 1/256 CK.

FIG. 4a illustrates Phase 1 of the read gate training algorithm during which the active DQS window of the gate strobe signal 196 is completely in a non-active zone. Phase 1 represents a starting phase, where the active window of the gate strobe signal 196 is at the default position and the active zone is multiple (e.g., 16 or more) clock cycles (CK) cycles away from the active DQS window of the gate strobe signal 196. In this phase, the sample values (RS and FS) are both logic HIGH. During this phase, the active DQS window of the gate strobe signal 196 is adjusted by increments of 0.5 CK and 1 CK until the falling sample takes a value of zero (see FIG. 4b).

FIG. 4b illustrates Phase 2 of the read gate training algorithm during which the active window of the gate strobe signal 196 approaches a preamble region of the secondary data strobe signal DQS_s, responsive to the adjustments/increments being made as described in Phase 1. Phase 2 represents a phase when the active window of the gate strobe signal 196 overlaps within the preamble, and FS takes a value of zero. During this phase, further adjustment/increment is made in steps of 1 CK.

FIG. 4c illustrates Phase 3 of the read gate training algorithm during which the active DQS window of the gate strobe signal 196 again falls in a non-active zone following the active zone responsive to the increments that were made in phase 2. After subsequent increments in phase 2, when the falling edge of the active DQS window of the gate strobe signal 196 exits the active zone, the falling sample value is logic 1 and the training logic determines that the falling edge of the active DQS window of the gate strobe signal 196 has exited the active zone and entered the non-active zone.

After Phase 3 and in Phase 4, the active DQS window of the gate strobe signal 196 is shifted backwards in step sizes of 0.25 CK, until the falling edge again samples one (FS=1), such that the falling edge of the gate strobe signal 196 has just re-entered the active zone, and by design, the rising edge of the gate strobe signal 196 is in the preamble zone (RS=0), as shown in FIG. 4d.

FIG. 4e illustrates Phase 5 of the read gate training algorithm representing a fine tuning or fine adjustment phase during which a rising edge of the active DQS window of the gate strobe signal 196 is adjusted/trained to lock to a first rising edge of the secondary data strobe signal (DQS_s). To this end, once the rising edge of the active DQS window is determined to be in the preamble zone of the second data strobe signal, as in phase 4, the finer phase of the algorithm starts, with the step size of each increment being $1/256$ of CK, and the rising sample (RS) is evaluated during each iteration until the rising edge samples a logic 1 value (RS=1) indicating that the rising edge of the active DQS window of the gate strobe signal 196 is locked to the first rising edge of the secondary data strobe signal DQS_s.

Phase 5 marks the end of the sweep and the training algorithm determines a final delay code to be used to adjust a timing of the active DQS window of the gate strobe signal 196. The final delay code results from the gate strobe signal 196 having a trained active DQS window.

In one embodiment, a representation of circuits within the memory controller 150 may be stored as data in a non-transitory computer-readable medium (e.g. hard disk drive, flash drive, optical drive). These representations may in the form of, for example, behavioral level descriptions, register transfer level descriptions, logic component level descriptions, transistor level descriptions or layout geometry-level descriptions.

Upon reading this disclosure, those of skill in the art may appreciate still additional alternative designs for synchronizing a gate strobe signal with a data read strobe signal within a memory controller to enable accurate sampling of a data signal received from a memory device. Thus, while particular embodiments and applications of the present disclosure have been illustrated and described, it is to be understood that the disclosure is not limited to the precise construction and components disclosed herein. Various modifications, changes and variations which may be apparent to those skilled in the art may be made in the arrangement, operation and details of the method and apparatus of the present disclosure herein without departing from the spirit and scope of the disclosure as defined in the appended claims.

What is claimed is:

1. A memory controller comprising:
    differential receiver circuitry to receive a differential data strobe signal pair and to generate a first data strobe signal based on the differential data strobe signal pair, the differential data strobe signal pair comprised of a first signal and a second signal;
    single ended receiver circuitry to receive the first signal of the differential data strobe signal pair and to generate a second data strobe signal based on the first signal of the differential data strobe signal pair;
    circuitry to generate a gating signal for gating the first data strobe signal, the circuitry receiving a gate strobe signal indicative of an active data strobe window and generating the gating signal based on the second data strobe signal and the gate strobe signal, the gating signal indicative of an adjusted version of the active data strobe window; and
    training circuitry to calibrate the active data strobe window of the gate strobe signal based on the second data strobe signal.

2. The memory controller of claim 1, wherein the circuitry triggers a start of the adjusted version of the active data strobe window based on the second data strobe signal.

3. The memory controller of claim 1, wherein the circuitry generates the gating signal further based on the first data strobe signal.

4. The memory controller of claim 1, wherein the training circuitry comprises:
    a first sampling circuit to generate a first data strobe sample by sampling the second data strobe signal at a rising edge of the gate strobe signal; and
    a second sampling circuit to generate a second data strobe sample by sampling the second data strobe signal at a falling edge of the gate strobe signal;
    wherein the training circuitry calibrates the active data strobe window based on the first data strobe sample and the second data strobe sample.

5. The memory controller of claim 1, wherein the differential receiver circuitry comprises a comparator to compare the first and second signals of the differential data strobe signal pair and to generate the first data strobe signal based on the comparison.

6. The memory controller of claim 1, wherein the single ended receiver circuitry comprises a comparator to compare the first signal from the differential data strobe signal pair to a reference voltage signal, and to generate the second data strobe signal based on the comparison.

7. A method of operation in a memory controller, the method comprising:
    receiving, at a differential receiver, a differential data strobe signal pair, the differential data strobe signal pair comprised of a first signal and a second signal;
    generating, by the differential receiver, a first data strobe signal based on the differential data strobe signal pair;
    receiving, at a single ended receiver, the first signal of the differential data strobe signal pair;
    generating, by the single ended receiver, a second data strobe signal based on the first signal of the differential data strobe signal pair;
    calibrating an active data strobe window of a gate strobe signal based on the second data strobe signal; and
    generating a gating signal for gating the first data strobe signal, the gating signal generated based on the second data strobe signal and the gate strobe signal, the gating signal indicative of an adjusted version of the active data strobe window.

8. The method of claim 7, wherein generating the gating signal comprises
triggering a start of the adjusted version of the active data strobe window based on the second data strobe signal.

9. The method of claim 7, wherein the generating of the gating signal is further based on the first data strobe signal.

10. The method of claim 7, further comprising:
generating a first data strobe sample by sampling the second data strobe signal at a rising edge of the gate strobe signal;
generating a second data strobe sample by sampling the second data strobe signal at a falling edge of the gate strobe signal; and
calibrating the active data strobe window based on the first data strobe sample and the second data strobe sample.

11. The method of claim 7, wherein generating the first data strobe signal comprises:
comparing the first and second signals of the differential data strobe signal pair; and
generating the first data strobe signal based on the comparison.

12. The method of claim 7, wherein generating the second data strobe signal comprises:
comparing the first signal from the differential data strobe signal pair and a reference voltage signal; and
generating the second data strobe signal based on the comparison.

13. A non-transitory computer readable medium storing a representation of a memory controller, the memory controller comprising:
differential receiver circuitry to receive a differential data strobe signal pair and to generate a first data strobe signal based on the differential data strobe signal pair, the differential data strobe signal pair comprised of a first signal and a second signal;
single ended receiver circuitry to receive the first signal of the differential data strobe signal pair and to generate a second data strobe signal based on the first signal of the differential data strobe signal pair;
circuitry to generate a gating signal for gating the first data strobe signal, the circuitry receiving a gate strobe signal indicative of an active data strobe window and generating the gating signal based on the second data strobe signal and the gate strobe signal, the gating signal indicative of an adjusted version of the active data strobe window; and
training circuitry to calibrate the active data strobe window of the gate strobe signal based on the second data strobe signal.

14. The computer readable medium of claim 13, wherein the training circuitry comprises:
a first sampling circuit to generate a first data strobe sample by sampling the second data strobe signal at a rising edge of the gate strobe signal; and
a second sampling circuit to generate a second data strobe sample by sampling the second data strobe signal at a falling edge of the gate strobe signal;
wherein the training circuitry calibrates the active data strobe window based on the first data strobe sample and the second data strobe sample.

* * * * *